(12) United States Patent
Nöbauer

(10) Patent No.: US 12,334,825 B2
(45) Date of Patent: Jun. 17, 2025

(54) ELECTRONIC CIRCUIT AND BUCK CONVERTER INCLUDING THE ELECTRONIC CIRCUIT

(71) Applicant: Infineon Technologies Austria AG, Villach (AT)

(72) Inventor: Gerhard Nöbauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 275 days.

(21) Appl. No.: 18/083,938

(22) Filed: Dec. 19, 2022

(65) Prior Publication Data
US 2023/0208301 A1    Jun. 29, 2023

(30) Foreign Application Priority Data
Dec. 28, 2021   (EP) .................................... 21217967

(51) Int. Cl.
*H02M 3/158* (2006.01)
*H03K 17/12* (2006.01)

(52) U.S. Cl.
CPC .......... *H02M 3/158* (2013.01); *H03K 17/122* (2013.01)

(58) Field of Classification Search
CPC .............................. H02M 3/158; H03K 17/122
See application file for complete search history.

(56) References Cited

U.S. PATENT DOCUMENTS

| | | | |
|---|---|---|---|
| 6,249,111 B1 | 6/2001 | Nguyen | |
| 8,907,418 B2 | 12/2014 | Noebauer et al. | |
| 2003/0038615 A1 | 2/2003 | Elbanhawy | |
| 2005/0280401 A1 | 12/2005 | Plankensteiner | |
| 2012/0268091 A1* | 10/2012 | Takemae | H02M 3/158 323/272 |
| 2013/0033243 A1* | 2/2013 | Takemae | H02M 3/1588 323/271 |
| 2014/0319602 A1* | 10/2014 | Vielemeyer | H01L 29/66477 257/330 |
| 2017/0033790 A1 | 2/2017 | Osanai | |

FOREIGN PATENT DOCUMENTS

EP    3240177 A1    11/2017

* cited by examiner

*Primary Examiner* — Rafael O De Leon Domenech
(74) *Attorney, Agent, or Firm* — Murphy, Bilak & Homiller, PLLC

(57) ABSTRACT

Disclosed is an electronic circuit. The electronic circuit includes a first transistor device, a second transistor device, and a third transistor device, each having a control node and a load path. The electronic circuit further includes a drive circuit. The load paths of the first and second transistor devices are connected in parallel, the load path of the third transistor device is connected in series with the load paths of the first and second transistor devices, and the first transistor device and the second transistor device are integrated in a common semiconductor body. The drive circuit is configured, based on a control signal, to successively switch on the first transistor device and the second transistor device, so that the second transistor device is switched on when the first transistor device is in an on-state.

20 Claims, 14 Drawing Sheets

ELECTRONIC CIRCUIT AND BUCK CONVERTER INCLUDING THE ELECTRONIC CIRCUIT

TECHNICAL FIELD

This disclosure relates in general to an electronic circuit and a buck converter including the electronic circuit.

BACKGROUND

Precise timing control for electronic circuits such as buck converters is required to reduce switching losses. Improved timing control schemes for electronic circuits are therefore needed.

SUMMARY

One example relates to an electronic circuit. The electronic circuit includes a first transistor device, a second transistor device, a third transistor device, and a drive circuit. Each of the first, second, and third transistor devices includes each a control node and a load path, wherein the load paths of the first and second transistor devices are connected in parallel, wherein the load path of the third transistor device is connected in series with the load paths of the first and second transistor devices, and wherein the first transistor device and the second transistor device are integrated in a common semiconductor body. The drive circuit is configured, based on a control signal, to successively switch on the first transistor device and the second transistor device, so that the second transistor device is switched on after the first transistor device has been switched on.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
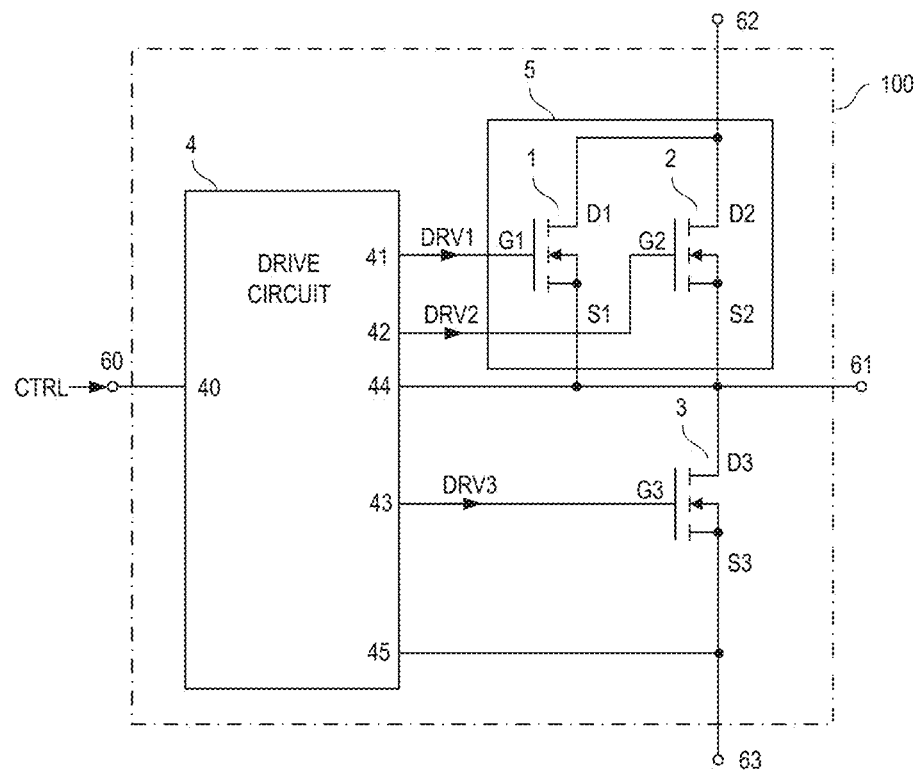
FIG. 1 illustrates one example of an electronic circuit that includes first, second, and third transistor devices and a drive circuit.

FIG. 1 illustrates one example of an electronic circuit 100. The electronic circuit 100 includes a first transistor device 1, a second transistor device 2, and a third transistor device 3. Each of these transistor devices 1, 2, 3 includes a control node G1, G2, G3, a first load node D1, D2, D3, a second load node S1, S2, S3, and a load path D1-S1, D2-S2, D3-S3 between a respective first load node D1, D2, D3 and a respective second load node S1, S2, S3. The load paths D1-S1, D2-S2 of the first and second transistor devices 1, 2 are connected in parallel. The load path D3-S3 of the third transistor device 3 is connected in series with the load paths D1-S1, D2-S2 of the parallel first and second transistor devices 1, 2. The first and second transistor devices 1, 2 being connected in parallel, according to one example, includes that the first load node D1 of the first transistor device 1 is connected to the first load node D2 of the second transistor device 2 and the second load node S1 of the first transistor device 1 is connected to the second load node S2 of the second transistor device 2. The third transistor device 3 being connected in series with the first and second transistor devices 1, 2 includes, according to one example, that the first load node D3 of the third transistor device 3 is connected to the second load nodes S1, S2 of the first and second transistor devices 1, 2.

According to one example, the first transistor device 1 and the second transistor device 2 are integrated in a common semiconductor body 5. This semiconductor body 5 is only schematically illustrated in the circuit diagram shown in FIG. 1. Examples for integrating the first and second transistor devices 1, 2 in the common semiconductor body 5 are explained in detail herein further below.

In the circuit diagram shown in FIG. 1, the first, second and third transistor devices 1, 2, 3 are each implemented as a MOSFET. More specifically, each of these transistor devices 1, 2, 3 is implemented as an n-type enhancement MOSFET. In this example, the first load nodes D1, D2, D3, are drain nodes of the transistor devices 1, 2, 3, the second load nodes S1, S2, S3 are source nodes, and the control nodes, G1, G2, G3 are gate nodes. However, implementing the transistor devices 1, 2, 3 as n-type enhancement MOSFETs is only an example. Any other type of MOSFET such as a p-type enhancement or depletion MOSFET, or an n-type depletion MOSFET may be used as well. It is even possible to implement the first and second transistor devices 1, 2 as MOSFETs of a first type, and to implement the third transistor device 3 as a MOSFET of a second type different from the first type.

Referring to FIG. 1, the electronic circuit further includes a drive circuit 4. The drive circuit 4 is configured to drive the first and second transistor devices 1, 2 based on a control signal CTRL received at an input 40 of the drive circuit 4. More specifically, the drive circuit 4 is configured to successively switch on the first transistor device 1 and the second transistor device 2. This may include that the first transistor device 1 switches on, to be in in an on-state, when the second transistor device 2 is in an off-state, and the second transistor device 2 switches on, to be in an on-state, when the first transistor device 1 is already in the on-state (has been switched on). This is schematically illustrated in FIG. 2.

Figure 2:
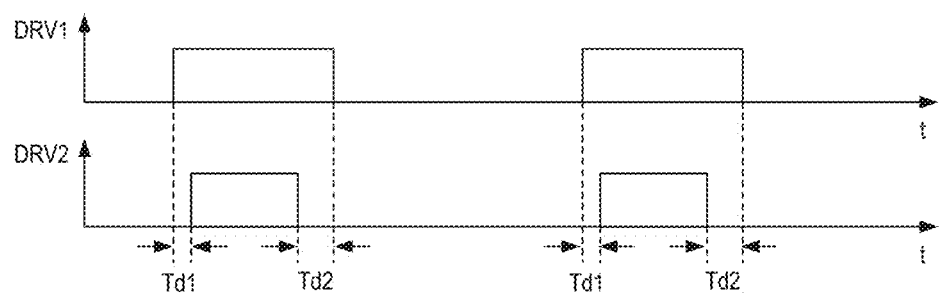
FIG. 2 shows signal diagrams that illustrate one example of driving the first and second transistor devices.

FIG. 2 shows signal diagrams of drive signals DRV1, DRV2 generated by the drive circuit 4. A first one DRV1 of these drive signals DRV1, DRV2 is received by the first transistor device 1 and is configured to switch on or off the first transistor device 1. A second one DRV2 of these drive signals DRV1, DRV2 is received by the second transistor device 2 and is configured to switch on or off the second transistor device 2. Each of the first and second drive signals DRV1, DRV2 either has an on-level or an off-level, wherein the on-level switches on the respective transistor device 1, 2, and the off-level switches off the respective transistor device 1, 2. Just for the purpose of illustration, in the example shown in FIG. 2, the on-level is represented by a high signal level of the respective drive signal DRV1, DRV2, and the off-level is represented by a low signal level of the respective drive signal DRV1, DRV2.

As can be seen from FIG. 2, the drive circuit 4 is configured to generate the first and second drive signals DRV1, DRV2 such that there is a first delay time Td1 between a time instance at which the signal level of the first drive signal DRV1 changes from the off-level to the on-level in order to switch on the first transistor device 1 and a second time instance at which the signal level of the second drive signal DRV2 changes from the off-level to the on-level in order to switch on the second transistor device 2. Thus, there is a time delay between switching on the first transistor device 1 and the second transistor device 2. This time delay Td1 is selected from between 0.5 nanoseconds (ns) and 2 nanoseconds, for example.

It should be noted that the time instances t1, t2 at which the signal levels of the drive signals DRV1, DRV2 change are not necessarily the time instances at which the transistor devices 1, 2 switch on. Instead, there may be delay times between the time instances t1, t2 at which the signal levels of the drive signals DRV1, DRV2 change and the time instances at which the transistor devices 1, 2 switch on.

The first and second drive signals DRV1, DRV2 are signals that are suitable to switch on or switch off the first and second transistor devices 1, 2. MOSFETS, as illustrated in FIG. 1, are voltage controlled devices that switch on or off dependent on a voltage level of a drive voltage received between the gate node and the source node. Thus, in the example shown in FIG. 1, the first drive signal DRV1 received by the first transistor device 1 is a drive voltage received between the gate node G1 and the source node S1 of the first transistor device 1. Equivalently, the second drive signal DRV2 received by the second transistor device 2 is a drive voltage received between the gate node G2 and the source node S2 of the second transistor device 2. For driving the first and second transistor devices 1, 2, the drive circuit 4 includes a first output node 41 connected to the gate node G1 of the first transistor device 1, a second output 42 connected to the gate node G2 of the second transistor device 2, and a first reference output 44 connected to the source nodes S1, S2 of the first and second transistor devices 1, 2. The first drive signal DRV1 is a voltage between the first output 41 and the first reference output 44, and the second drive signal DRV2 is a voltage between the second output 42 and the first reference output 44. The on-levels and off-levels of the drive signals DRV1, DRV2 are selected dependent on the type of transistor device used to implement the first and second transistor devices 1, 2.

According to one example, the drive circuit 4 is further configured to successively switch off the first and second transistor devices 1, 2 such that there is a delay time between switching off the second transistor device 2 and the first transistor device 1. This is also illustrated in FIG. 2.

Referring to FIG. 2, the second transistor device 2 is switched off before the first transistor device 1 is switched off. That is, there is a second delay time Td2 between a time instance at which the signal level of the second drive signal DRV2 changes from the on-level to the off-level and a time instance at which the signal level of the first drive signal DRV1 changes from the on-level to the off-level. According to one example, the second delay time Td2 is selected from between 1 nanosecond (ns) and 10 nanoseconds, for example.

According to one example, the drive circuit 4 is further configured to drive the third transistor device 3 based on the control signal CTRL. For this, the drive circuit 4 generates a third drive signal DRV3 that is received by the third transistor device 3 and is configured to switch on or off the third transistor device 3. According to one example, the third drive signal DRV3 is a drive voltage provided by the drive circuit 4 between a third output 43 and a second reference output 45, wherein the gate node G3 of the third transistor device 3 is connected to the third output 43 and the source node S3 of the third transistor device 3 is connected to the second reference output 45. One example for driving the third transistor device 3 dependent on the control signal CRL is explained in detail herein further below.

Switching on the first and second transistor devices 1, 2 in a delayed fashion as explained with reference to FIG. 2 may help to reduce switching losses when operating the electronic circuit in a switched-mode fashion. Operating the electronic circuit in a switched-mode fashion may include alternatingly switching on and off the third transistor device 3 and the parallel circuit with the first and second transistor devices 1, 2 such that at each time only one of the third transistor device 3 and the parallel circuit with the first and second transistor devices 1, 2 is in an on-state. According to one example, the parallel circuit is in the on-state when at least the first transistor device 1 is in the on-state, wherein switching on and off the parallel circuit with the first and second transistor devices 1, 2 may include switching on and off the first and second transistor devices 1, 2 as explained with reference to FIG. 2.

Figure 3:
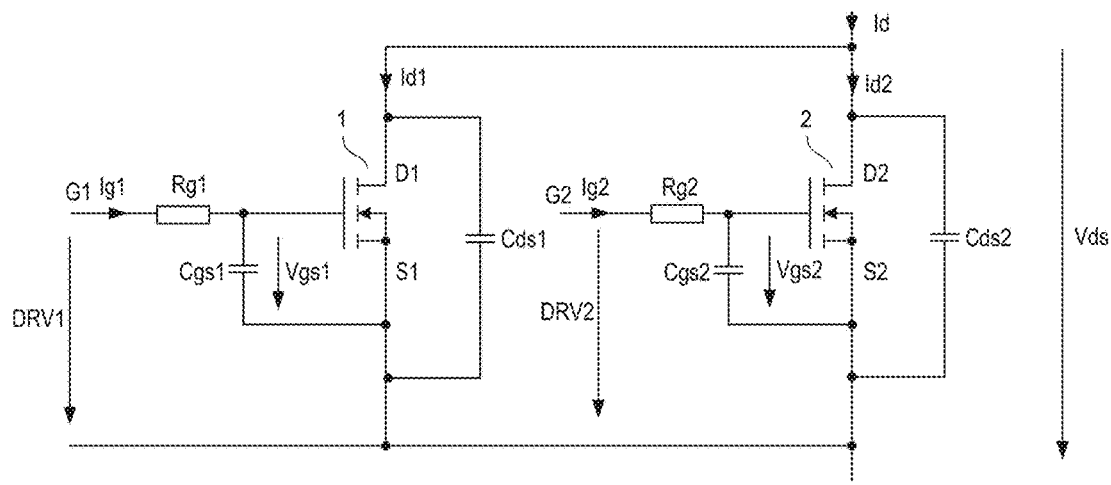
FIG. 3 shows a circuit diagram that includes the first and second transistor devices and some of their parasitic devices.
Figure 4:
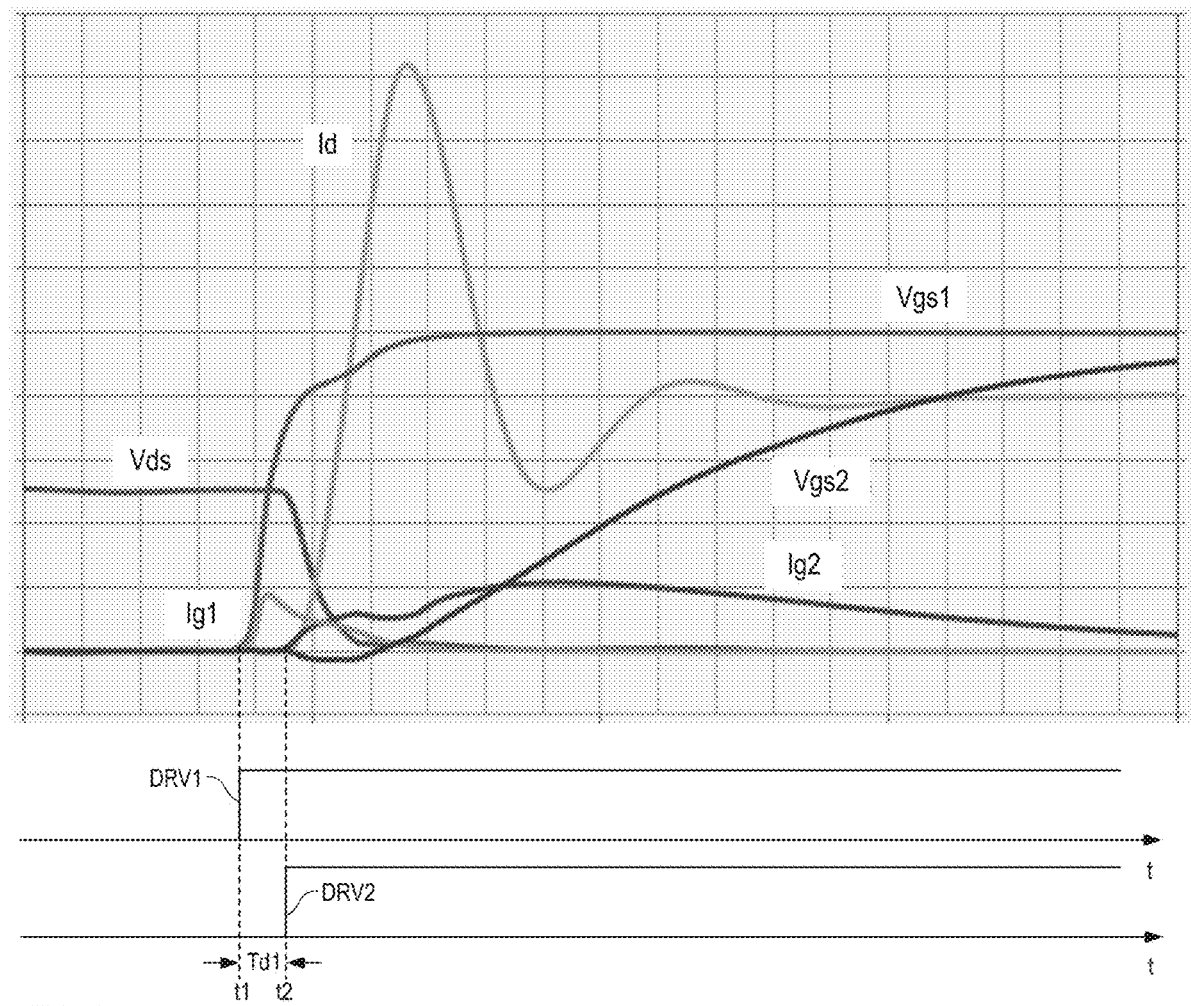
FIG. 4 shows signal diagrams of some of the signals indicated in FIG. 3 in an operating scenario in which the first transistor device switches on before the second transistor device.

FIGS. 3 and 4 illustrate in which way a reduction of the switching losses can be achieved when switching on the first transistor device 1 before switching on the second transistor device 2 as explained with regard to FIG. 2. FIG. 3 shows a circuit diagram that illustrates the first and second transistor devices 1, 2 and some of their parasitic devices, and FIG. 4 shows signal diagrams of the first and second drive signals DRV1, DRV2 and some of the signals illustrated in the circuit diagram of FIG. 3 when the first and second transistor devices 1, 2 are switched on in a delayed fashion.

Referring to FIG. 3, and as explained above, each of the first and second transistor devices 1, 2 includes a gate node G1, G2 and a source node S1, S2, wherein the respective drive signal (drive voltage) DRV1, DRV2 is received between the gate node G1, G2 and the source node S1, S2. Each of the first and second transistor devices 1, 2 switches on when an internal gate-source-voltage Vgs1, Vgs2 reaches a respective threshold voltage of the transistor device. The internal gate-source voltage Vgs1, Vgs2 is a voltage across an internal gate-source capacitance Cgs1, Cgs2, which is a capacitance between an internal gate node and the source node S1, S2. These internal gate-source-capacitances Cgs1, Cgs2 are represented by capacitors in the example shown in FIG. 3. Furthermore, there may be an internal gate resistor Rg1, Rg2 between the gate node G1, G2 and the respective internal gate node.

In each of the first and second transistor devices 1, 2, the gate resistor Rg1, Rg2 and the gate-source capacitance Cgs1, Cgs2 form an RC element that may cause a certain delay time between a time instance at which the signal level of the respective drive signal DRV1, DRV2 changes from the off-level to the on-level and the time instance at which the internal gate-source voltage Vgs1 reaches the respective threshold voltage of the transistor device 1, 2. Basically, the higher the resistance of the gate resistor the slower the internal gate-source voltage Vgs1, Vgs2 increases, and the larger the internal gate-source capacitance Cgs1, Cgs2 the slower the respective internal gate-source voltage Vgs1, Vgs2 increases.

Referring to FIG. 3, each of the first and second transistor devices 1, 2 further includes a drain-source capacitance Cds1, Cds2, which is a capacitance between the drain node D1, D2 and the source node S1, S2 of the respective transistor device 1, 2.

For the purpose of explanation it is assumed that a voltage is applied across the parallel circuit with the first and second transistor devices 1, 2, that is, it is assumed that a voltage is applied between the drain nodes D1, D2 and the source nodes S1, S2 of the first and second transistor devices 1, 2. Furthermore, it is assumed that the first and second transistor devices 1, 2 are in the off-state. In this case, a drain current Id, which is an overall current through the load paths D1-S1, D2-S2 of the first and second transistor devices 1, 2 is zero, and a drain-source-voltage Vds, which is a voltage between the drain nodes D1, D2 and the source nodes S1, S2 of the first and second transistor devices 1, 2 has a voltage level that equals the voltage applied to the parallel circuit with the first and second transistor devices 1, 2. In the off-state of the first and second transistor devices 1, 2, the drain-source capacitances Cds1, Cds2 are charged, wherein the voltage across the capacitors Cds1, Cds2 equals the drain-source voltage Vds.

According to one example, the first transistor device 1 is significantly smaller than the second transistor device 2. "Smaller" includes that the gate-source capacitance Cgs1 of the first transistor device 1 is smaller than the gate-source capacitance Cgs2 of the second transistor device 2, so that the first transistor device 1 switches on faster than the second transistor device 2. Equivalently, the first transistor device 1 switches off faster than the second transistor device 2. According to one example, a size of the first transistor device 1 is between 5% and 20% of a size of the second transistor device 2, so that the gate-source capacitance Cgs1 of the first transistor device 1 is only between 5% and 20% of the gate-source capacitance Cgs2 of the second transistor device 2.

Referring to the above, when the first transistor device 1 is smaller than the second transistor device 2, the first transistor device 1 switches on faster than the second transistor device 2. This is illustrated in FIG. 4. In FIG. 4, t1 denotes a first time instance at which the signal level of the first drive signal DRV1 changes from the off-level to the on-level. Furthermore, t2 denotes a time instance at which the signal level of the second drive signal DRV2 changes from the off-level to the on-level. In FIG. 4, Ig1 denotes a first gate current, which is the current into the gate-source capacitance Cgs1 of the first transistor device 1, and Ig2 denotes a second gate current, which is the current into the gate-source capacitance Cgs2 of the second transistor device 2. As can be seen from FIG. 4, the first gate current Ig1 starts to increase at the first time instance t1 and decreases to zero when the first gate-source capacitance Cgs1 has been charged to a voltage level that is given by the first drive signal DRV1. Equivalently, the second gate current Ig2 starts to increase at the second time instance t2 and decreases as the second gate-source capacitance Cgs2 charges (the time instance at which the second gate-source voltage Vgs2 reaches the voltage level defined by the second drive signal DRV2 is out of view in the diagram shown in FIG. 4). Referring to FIG. 4, the first gate-source voltage Vgs1 increases much faster than the second gate-source voltage Vgs2, which is because the first gate-source capacitance Cgs1 is much smaller than the second gate-source capacitance Cgs2.

Referring to FIG. 4, there may be a time period in which the gate-source Vgs2 of the second transistor device 2 is slightly negative. This may be due to parasitic effects, such as an inevitable gate-drain capacitance between the gate node D2 and the gate node G2. The gate-drain capacitance capacitively couples the drain node D2 and the gate node G2 of the second transistor device 2. When the first transistor device 1 switches on, the electrical potential at the drain nodes of both the first transistor device 1 and the second transistor device 2 decreases. Due to the capacitive coupling between the drain node D2 and the gate node G2 of the second transistor device, the potential at the gate node G2 of the second transistor device 2 may turn negative until the second transistor device 2 switches on.

In a transition phase of a transistor, which is a time period in which the transistor device changes from the off-state to the on-state, the dissipated power may be particularly high when current flows through the transistor device and, at the same time, the drain-source voltage is still high. The drain-source voltage is the voltage between the drain node and the source node of the transistor device.

In the parallel circuit with the first and second transistor devices 1, 2 switching on the first transistor device 1 provides a conducting current path between the drain node D1 and the source node S1 of the first transistor device 1, so that both the drain-source capacitance Cds1 of the first transistor device 1, and the drain-source capacitance Cds2 of the second transistor device 2 are discharged and the drain-source voltage Vds essentially decreases to zero. As will be explained in detail herein further below, the circuit that includes the parallel circuit with the first and second transistor devices 1, 2 and the third transistor device 3 connected in series with the parallel circuit is operated such that, at each time, either the third transistor device 3 or the parallel circuit with the first and second transistor devices 1, 2 is in the off-state. The off-state of the parallel circuit includes that both the first transistor device 1 and the second transistor device 2 is in the off-state. Thus, whenever the first transistor device 1 switches on the third transistor device 3 is in the off-state, so that the third transistor device 3 takes over the voltage applied across the series circuit with the third transistor device 3 and the parallel circuit 1, 2 and the voltage Vds across the parallel circuit with the first and second transistor devices can decrease to zero.

Referring to FIG. 4, there is a delay time between a time instance at which the first transistor device 1 switches on and a time instance at which the drain current Id starts to increase. The first transistor device 1 switches on when the gate-source voltage Vgs1 increases and reaches a threshold voltage of the first transistor device 1. The increase of the gate-source voltage Vgs1 is due to the gate-source capacitance Cgs1 being charged by the first gate current Ig1 when the drive signal DRV1 changes from the off-level to the on-level. The delay time between switching on the first transistor device and the increase of the drain current Id may be due to parasitic inductances connected in series with the parallel circuit including the first and second transistor devices 1, 2. These parasitic inductances may include line inductances of connection lines connected to the drain and source nodes D1, D2, S1, S2. The connection lines may include internal and external connection lines. "Internal connection lines" include connection lines inside the electronic circuit 100 and "external connection lines" include connection lines outside the electronic circuit 100.

Due to the delay time between switching on the first transistor device 1 and the increase of the drain current Id, the voltage Vds across the parallel circuit significantly decreases before the drain current Id significantly increases. The decrease of the voltage Vds across the parallel circuit is due to drain-source capacitances Cds1, Cds of the first and second transistor devices 1, 2 being discharged by the conducting first transistor device 1. Decreasing the voltage Vd across the parallel circuit with the first and second transistors 1, 2 before the drain current Id increases helps to reduce losses in the parallel circuit during the switching process, wherein such losses are given by the voltage Vd multiplied with the current Id.

Switching on the second transistor device 2 after the first transistor device 1, that is, having the delay time Td1 between the time instance t1 at which the first drive signal DRV1 changes from the off-level to the on-level and the time instance t2 at which the first drive signal DRV1 changes from the off-level to the on-level, ensures that there is a conducting channel in parallel with the drain-source capacitance Cds1, Cds2 to discharge the drain-source capacitance Cds1, Cds2 before the drain current Id increases. Switching on the first and second transistor devices includes providing a respective gate current Ig1, Ig2 by the drive circuit. The driving capability of the drive circuit 4 may be limited, that is, an overall gate current that includes the first gate current Ig1 plus the second gate current Ig2 may be limited to a maximum current level. Switching on the first transistor device 1 before the second transistor device 2 has the effect, that, at the time of switching on the first transistor device 1, the entire drive current is available for switching on the first transistor device 1, that is, for charging the gate-source capacitance of the first transistor device 1, so that the first transistor device 1 rapidly switches on and discharges the drain-source capacitances Cds1, Cds2. If the first and second transistor devices 1, 2 would be switched on at the same time, the available drive current would be shared by the first and second transistor devices 1, 2. In this case, the first transistor device 1 would switch on slower, so that the drain current Id may increase before the drain-source capacitances Cds1, Cds2 have been discharged.

The duration of the delay time Td1 may be just long enough, such as between 0.5 and 2 ns, for the first transistor device 1 to switch on before the second transistor device 2 draws a gate current Ig2 from the drive circuit 4.

It should be noted that the overshoot of the drain current Id illustrated in FIG. 4 is due to parasitic effects. As can be seen, the drain current Id may significantly increase due to the conducting first transistor device 1 before the second transistor device 2 switches on.

Figure 5:
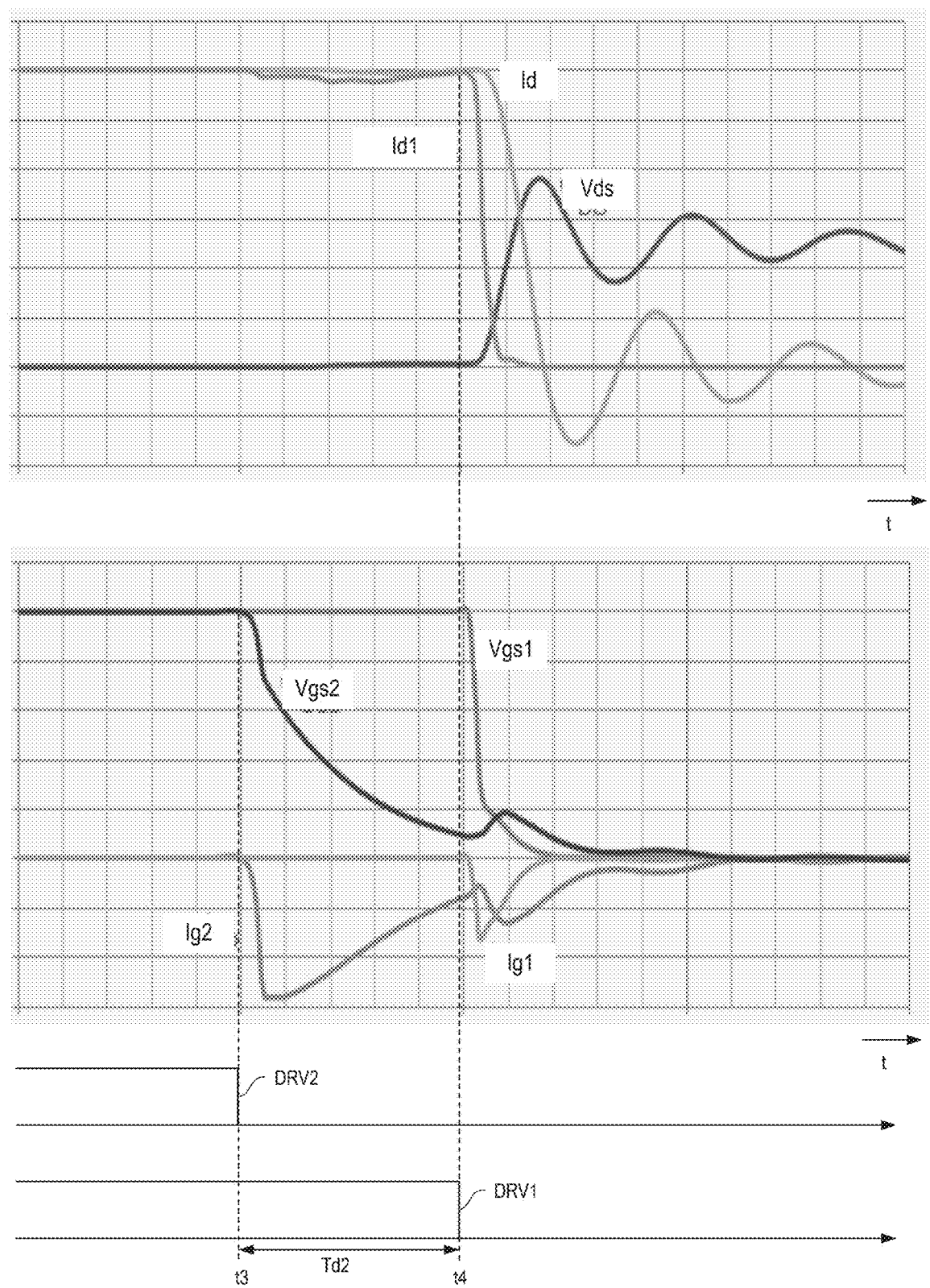
FIG. 5 shows signal diagrams of some of the signals indicated in FIG. 3 in an operating scenario in which the first transistor device switches off after the second transistor device.

Referring to the above, there may be delay times between the time instances t1, t2 at which the signal levels of the drive signals DRV1, DRV2 change and the time instances at which the transistor devices 1, 2 switch on. This is because switching on the respective transistor device 1, 2 requires the respective gate-source capacitance Cgs1, Cgs2 to be charged to a certain extent, wherein such charging requires some time. As the first transistor device 1 is smaller than the second transistor device 2 the gate-source capacitance Cgs1 of the first transistor device 1 is smaller than the gate-source capacitance Cgs2 of the second transistor device 2. Thus, at a given drive current, the first transistor device 1 switches on faster than the second transistor device 2. FIG. 5 shows signal diagrams that illustrate switching off the second transistor device 2 before switching off the first transistor device 1. In FIG. 5, t3 denotes a time instance at which the signal level of the second drive signal DRV2 changes from the on-level to the off-level, and t4 denotes a time instance at which the signal level of the first drive signal DRV1 changes from the on-level to the off-level. Referring to FIG. 5, beginning at the third time instance t3, the second gate-source capacitance Cgs2 is discharged by the second gate current Ig2 (which is negative), so that the second gate-source voltage Vgs2 decreases.

Referring to the above, the first transistor device 1 switches faster than the second transistor device. Switching off the first transistor device 1 after switching off the second transistor device 2 has the effect that the drain current Id continues to flow until the first transistor device switches off. As the first transistor device 1 rapidly switches off, the drain current Id rapidly decreases and the drain-source voltage rapidly increases, so that switching losses are reduced. The second delay time Td2 is such, for example, that the second transistor device 2 has been switched off before the first transistor device 1 starts to switch off. In FIG. 1, Id denotes the drain current flowing into the parallel circuit, and Id1 denotes the current through the drain-source path of the first transistor device 1. As can be seen, the overall drain current Id continues to flow after the first transistor device has been switched off, that is, after the drain-source current Id1 has decreased to zero. The current Id flowing after the first transistor device 1 has been switched off charges the drain source capacitance Cds1, Cds2 and does not contribute to the switching losses.

Figure 6:
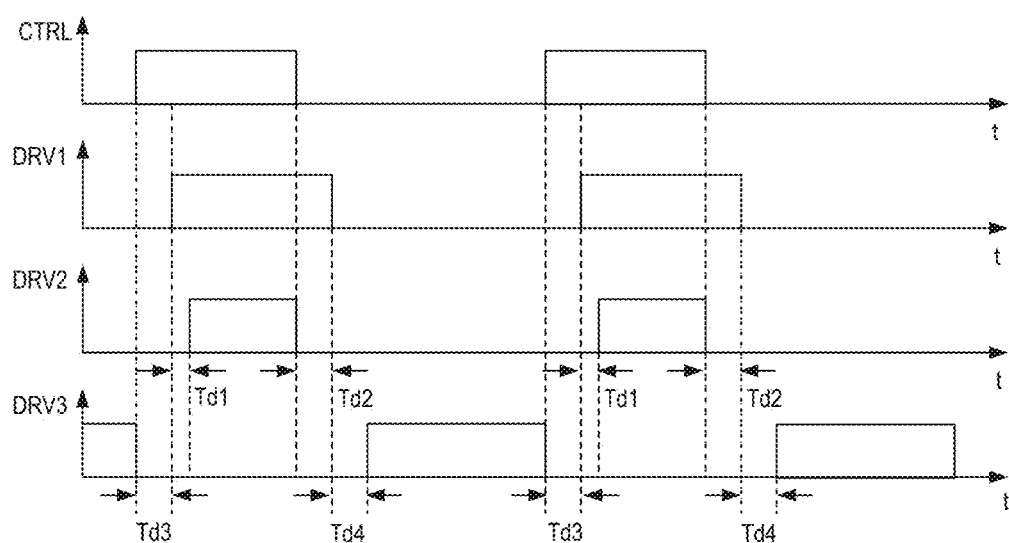
FIG. 6 shows signal diagrams that illustrate one example of driving the first, second, and third transistor devices in the electronic circuit according to FIG. 1.

Referring to the above, the drive circuit 4 can be configured to drive the first, second, and third transistor devices 1, 2, 3 based on the control signal CTRL received by the drive circuit 4. One example of a method for driving the transistor devices 1, 2, 3 based on the control signal CTRL is illustrated in FIG. 6. FIG. 6 shows signal diagrams of the control signal CTRL and the first, second, and third drive signals DRV1, DRV2, DRV3 received by the transistor devices 1, 2, 3. More specifically, FIG. 6 shows signal diagrams of the control signal CTRL and the drive signal DRV1, DRV2, DRV3 in two successive drive cycles, wherein in each of these drive cycles each of the transistor devices 1, 2, 3 is switched on for a respective on-time.

According to one example, the control signal CTRL either has a first signal level or a second signal level. The first signal level is a low signal level and the second signal level is a high signal level, for example. Referring to FIG. 6, generating the drive signals DRV1, DRV2, DRV3 based on the control signal CTRL may include changing the signal level of the third drive signal DRV3 from the on-level to the off-level when the signal level of the control signal CTRL changes from the first level to the second level. Furthermore, the second drive signal DRV2 may be generated such that the signal level of the second drive signal DRV2 changes from the on-level to the off-level when the signal level of the control signal CTRL changes from the second signal level back to the first signal level.

In the example shown in FIG. 6, the first drive signal DRV1 is generated such that the signal level changes from the off-level to the on-level after a third delay time Td3 after the signal level of the control signal CTRL changes from the first level to the second level. The second drive signal DRV2 changes from the off-level to the on-level after the first delay time Td1 after the signal level of the first drive signal DRV1 changes from the off-level to the on-level, or after a delay time given by Td1+Td3 after the signal level of the control signal CTRL changes from the first level to the second level. The signal level of the first drive signal DRV1 changes from the on-level to the off-level after the second delay time Td2 after the signal level of the control signal CTRL changes from the second level to the first level and the signal level of the second drive signal DRV2 changes from the on-level to the off-level. The signal level of the third drive signal DRV3 again changes from the off-level to the on-level after a fourth delay time Td4 after the signal level of the first drive signal DRV1 changes from the on-level to the off-level.

The third and fourth delay times Td3, Td4 are selected such that a cross-current through the series circuit including the parallel circuit 1, 2 and the third transistor 3 is avoided. That is, these delay times Td3, Td4 are selected such that there is no time period in which the third transistor device 3 and at least one of the first and second transistor devices 1, 2 is conducting at the same time.

It should be noted that inevitably there may be short delay times between time instances at which the signal level of the control signal CTRL changes and corresponding time instances at which the signal levels of the first and the third drive signals DRV1, DRV3 change. Such delay times, however, are not illustrated in FIG. 6.

Figure 7:
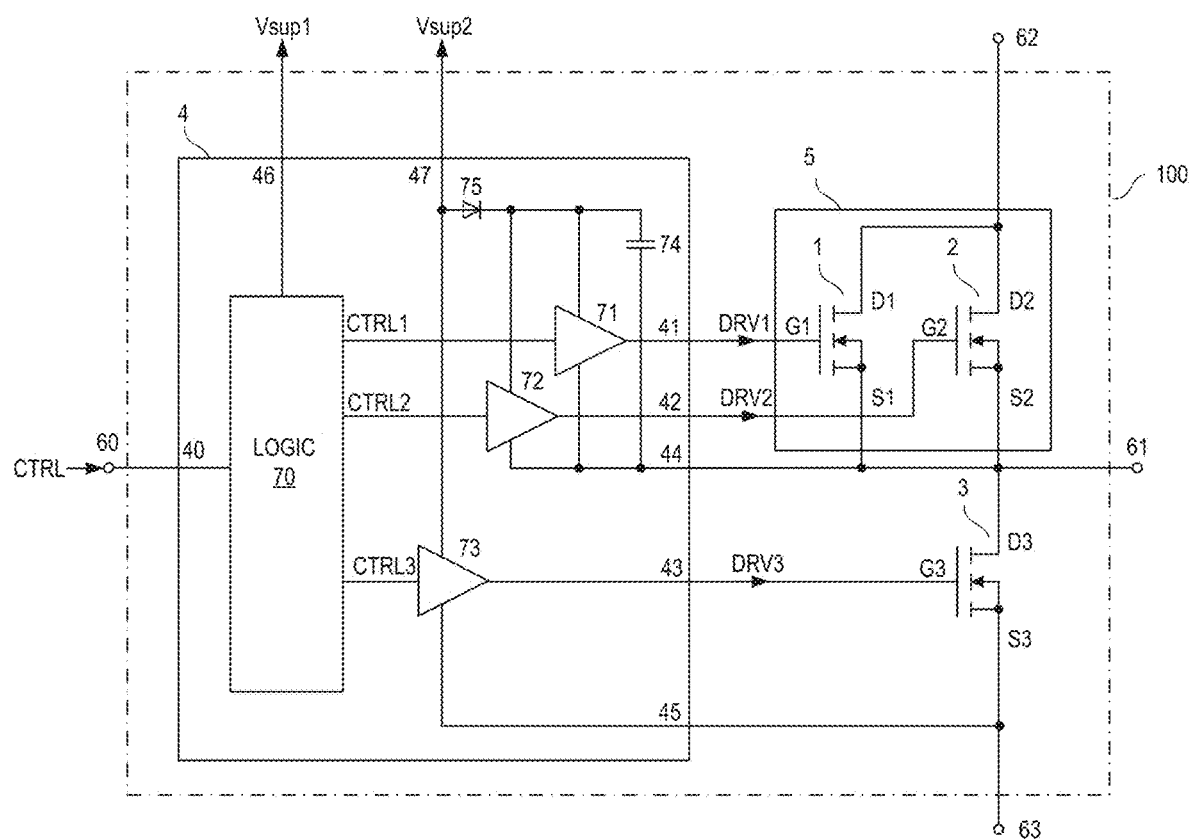
FIG. 7 illustrates one example of the drive circuit in greater detail.

FIG. 7 schematically illustrates one example of the drive circuit 4 in greater detail. In this example, the drive circuit 4 includes a logic circuit 70 that receives the control signal CTRL and that is configured to generate first, second, and third control signals CTRL1, CTRL2, CTRL3 based on the control signal CTRL. The first control signal CTRL1 governs switching on and switching off the first transistor device 1, the second control CTRL2 governs switching on or switching off the second transistor device 2, and the third control signal CTRL3 governs switching on and switching off the third transistor device 3. The first control signal CTRL1 is received by a first driver 71, wherein the first driver 71 is configured to generate the first drive signal DRV1 based on the first control signal CTRL1; the second control signal CTRL2 is received by a second driver 72, wherein the second driver 72 is configured to generate the second drive signal DRV2 based on the second control signal CTRL2; and the third control signal CTRL3 is received by a third driver 73, wherein the third driver 73 is configured to generate the third drive signal DRV3 based on the control signal CTRL3. Except for propagation delays that may be generated by the first, second, and third drivers 71, 72, 73, a timing of the drive signals DRV1, DRV2, DRV3 correspond to a timing of the control signals CTRL1, CTRL2, CTRL3. That is, the control signals CTRL1, CTRL2, CTRL3 define those time instances at which the signal levels of the drive signals DRV1, DRV2, DRV3 change from the off-level to the on-level or from the on-level to the off-level. According to one example, signal levels of the control signals CTRL1, CTRL2, CTRL3 are either zero or Vsup1, wherein Vsup1 is the voltage level of a first supply voltage received by the logic circuit 70 via a first supply input 46 of the drive circuit 4.

According to one example, the drivers 71, 72, 73 are supplied by a second supply voltage Vsup2, which is received at a second supply input 47 of the drive circuit 4. The third driver 73 may directly receive the second supply voltage Vsup2, so that a signal level of the third drive signal DRV3 can be generated to be either zero or equal to the second supply voltage Vsup2. The first and second drivers 71, 72 may be supplied by a bootstrap circuit that includes a bootstrap capacitor 74 and a rectifier element 75, wherein the rectifier element 75 is connected between the second supply input 47 and the bootstrap capacitor 74. The voltage across the bootstrap capacitor 74 essentially equals the second supply voltage Vsup2, wherein the bootstrap capacitor 74 is charged each time the third transistor device 3 is in an on-state. Thus, signal levels of the first and second drive signals DRV1, DRV2 can be generated to be either zero or equal to the second supply voltage Vsup2.

Referring to the above, switching on the first and second transistor devices 1, 2 includes charging gate-source capacitances of the first and second transistor devices 1, 2 by respective gate currents Ig1, Ig2. These gate currents, in the example shown in FIG. 7, are provided by the bootstrap capacitors. The bootstrap capacitor 74 itself and parasitic line inductances between the bootstrap capacitor 74 and the gate nodes G1, G2 may limit the overall gate current, as explained above, that can be provided by the drive circuit 4.

Figure 8:
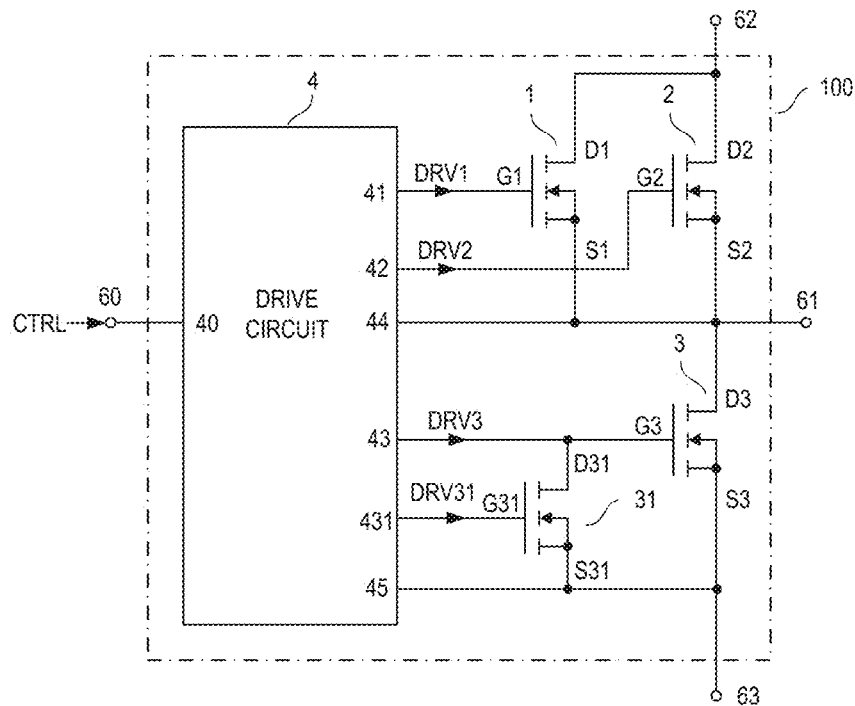
FIG. 8 illustrates one example of an electronic circuit that is based on the electronic circuit according to FIG. 1 and additionally includes a fourth transistor device.

FIG. 8 shows an electronic circuit according to another example. In this example, the electronic circuit, in addition to the first, second and third transistor devices 3, includes a further transistor device 31 which includes a load path D31-S31 connected between the gate node G3 and the source node S3 of the third transistor device 3. According to one example, the further transistor device 31 is a MOSFET, in particular an n-type enhancement MOSFET. The load path D31-S31 of this MOSFET is formed between a drain node D31 and a source node S31. According to one example, the further transistor device 31 is driven by a further drive signal DRV31 provided by the drive circuit at a further drive output 431. The further transistor device 31 serves to rapidly switch off the third transistor device 3. When the further transistor device 31 switches on, there is a short-circuit between the gate node G3 and the source node S3 of the third transistor device 3, so that the internal gate-source capacitance (not shown) of the third transistor device 3 is rapidly discharged.

Figure 9:
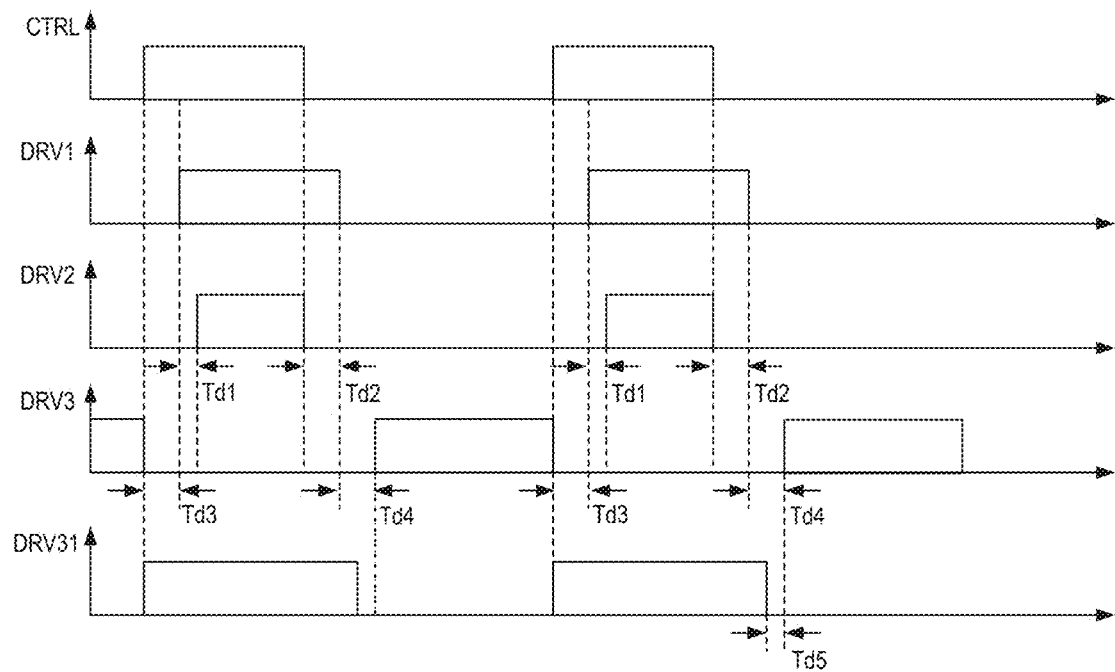
FIG. 9 shows signal diagrams that illustrate one example of driving the first, second, and third transistor devices in the electronic circuit according to FIG. 7.

FIG. 9 is based on FIG. 6 and shows signal diagrams of the control signal CTRL, the first, second, and third drive signals DRV1, DRV2, DRV3, and the further drive signal DRV31. Referring to FIG. 9, the further drive signal DRV31 may be generated such that its signal level changes from the off-level to the on-level (in order to switch off the third transistor device 3) when the signal level of the control signal CTRL changes from the first level to the second level. Furthermore, the further drive signal DRV31 may be generated such that its signal level changes from the on-level to the off-level at any time within the fourth delay time Td4. According to one example, the signal level of the further drive signal DRV31 changes from the on-level to the off-level at the same time at which the signal level of the first drive signal DRV1 changes from the on-level to the off-level.

Figure 10:
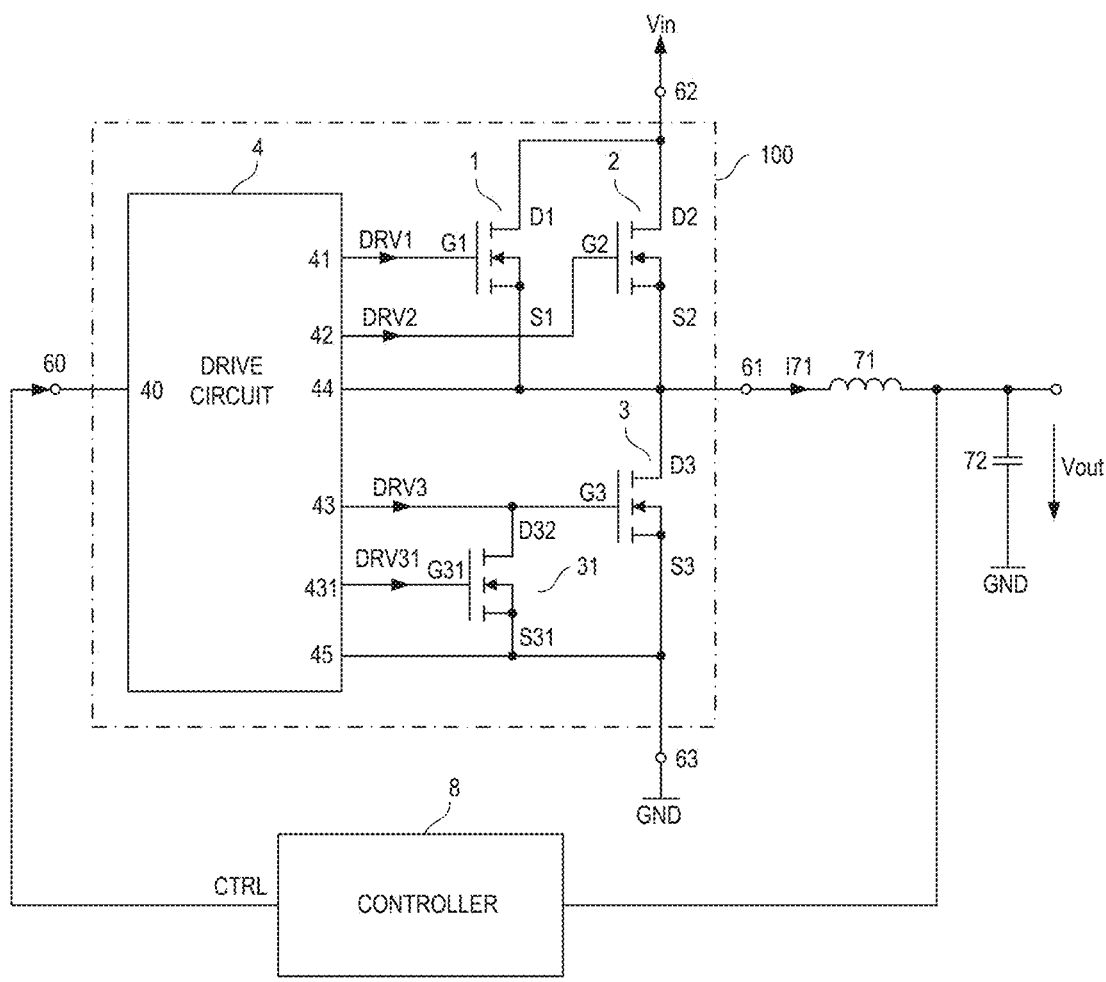
FIG. 10 illustrates one example of a buck converter that includes an electronic circuit according to FIG. 8.

FIG. 10 illustrates one example of a buck converter that includes an electronic circuit 100 of the type explained hereinbefore. In the following, a circuit node 60 at which the control signal CTRL is received is referred to as control input, a circuit node 61 at which the parallel circuit with the first and second transistor devices 1, 2 is connected to the third transistor device 3 is referred to as output node of the control circuit, and circuit nodes 62, 63 are referred to as input voltage nodes. The series circuit including the third transistor device 3 and the parallel circuit with the first and second transistor devices 1, 2 is connected between the input voltage nodes 62, 63. The input voltage nodes 62, 63 are configured to receive an input voltage Vin, wherein the buck converter is configured to generate an output voltage Vout based on the input voltage Vin.

The timing diagrams illustrated in FIGS. 4 and 5 may relate to an operating scenario in which the electronic circuit 100 is part of a buck converter.

Referring to FIG. 10, the buck converter further includes an inductor 71 and an output capacitor 72, wherein a series circuit including the inductor 71 and the output capacitor 72 is connected between the output node 61 and a ground node GND. The input voltage Vin and the output voltage Vout are referenced to the ground node GND. The output voltage Vout is available across the output capacitor 72.

Referring to FIG. 10, the buck converter further includes a controller 8. The controller 8 is configured to sense the output voltage Vout and to generate the control signal CTRL based on the sensed output voltage Vout and a reference voltage wherein the reference voltage defines a desired voltage level of the output voltage Vout. In the buck converter according to FIG. 10, whenever the second transistor device 2 is in the on-state, a voltage across the series circuit with the inductor 71 and the capacitor 72 essentially equals the input voltage Vin, so that a current I71 through the inductor 71 increases. When the second transistor device 2 (and the first transistor device 1) is in the off-state and the third transistor device 3 is in the on-state, the third transistor device 3 acts as a freewheeling element or synchronous rectifier that takes over the inductor current I71.

In a conventional way, by suitably adjusting a duty cycle of the drive signal DRV2 received by second transistor device 2—wherein this duty cycle can be adjusted by the control signal CTRL—the inductor current I71 and, therefore, the output voltage Vout can be regulated. The output voltage Vout may be received by a load (not shown in FIG. 10).

According to one example, the first, second, and third transistor devices 1, 2, 3, the drive circuit 4, and the optional further transistor device 31 are arranged in one integrated circuit package. This integrated circuit package may include only four terminals, a first terminal that forms the output node 61, second and third terminals that form the input voltage terminals 62, 63, and a fourth terminal that forms the control input 60. The package may include two or more semiconductor bodies (semiconductor dies). (a) According to one example, the package includes three dies, a first die, in which the first and second transistor devices 1, 2 are integrated, a second die, in which the drive circuit 4 is integrated and a third die, in which the third transistor device 3 is integrated. The further transistor device 31 may be integrated in the same die as the drive circuit 4. (b) According to another example, the further transistor device 31 is integrated on the same die as the third transistor device 3. In this case, the further transistor device 31 may help to rapidly switch off the third transistor device 3. This is because connection lines between theses transistor devices 3, 31 are short, so that parasitic inductances and parasitic resistances, which may reduce the switching speed, are low. (c) According to another example, the first, second, and third transistor devices 1, 2, 3 and the optional further transistor device 31 are integrated in one semiconductor die and the drive circuit 4 is integrated in a further semiconductor die.

Referring to FIG. 7, the drive circuit 4 may include a bootstrap capacitor 74. According to one example, the bootstrap capacitor is a capacitor integrated in the integrated circuit forming the drive circuit 4. According to another example, the drive circuit 4 is only partially integrated in an integrated circuit, wherein the bootstrap capacitor 74 is an external discrete capacitor that is connected to the integrated circuit that forms the remainder of the drive circuit 4.

Figure 11:
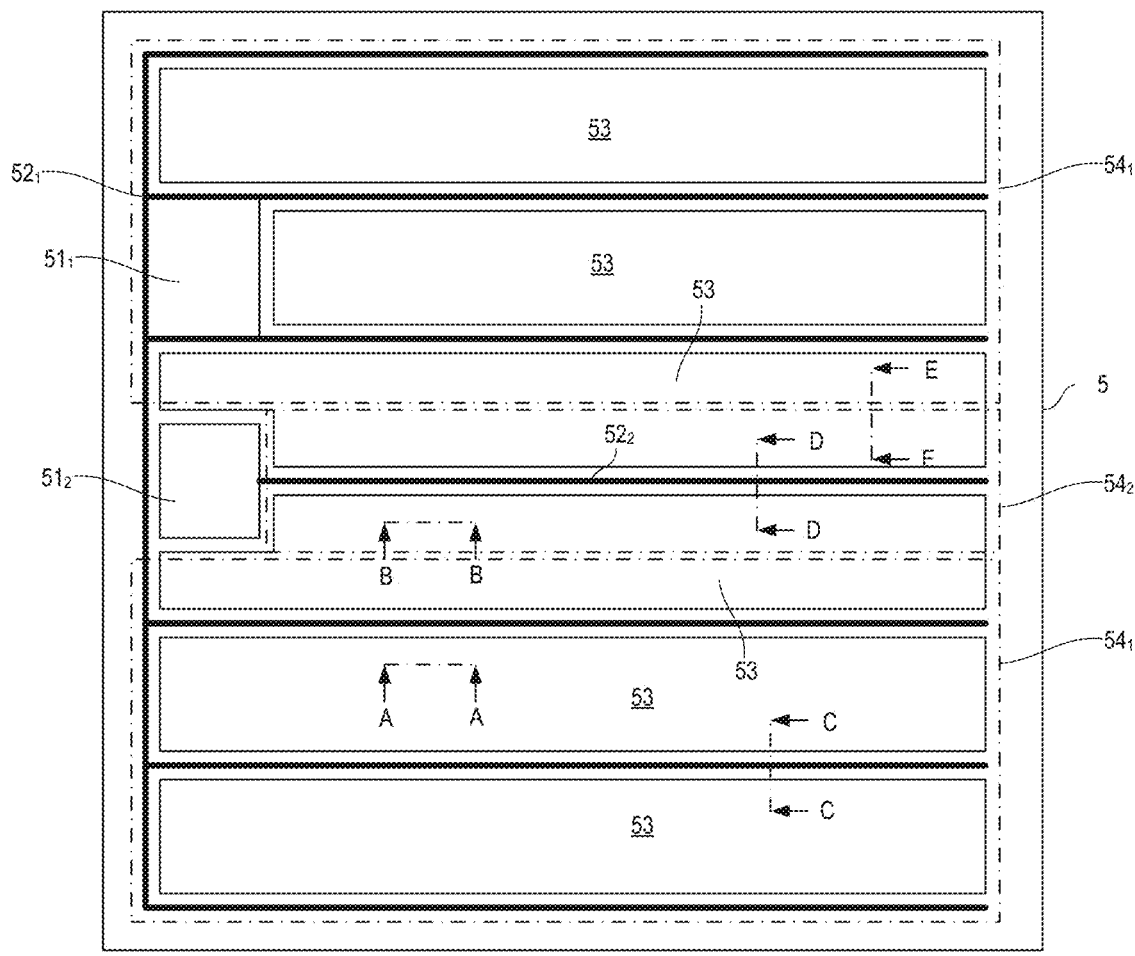
FIGS. 11 and 12 show top views of a semiconductor die to illustrate different examples of integrating the first and second transistors in a common semiconductor body.
Figure 12:
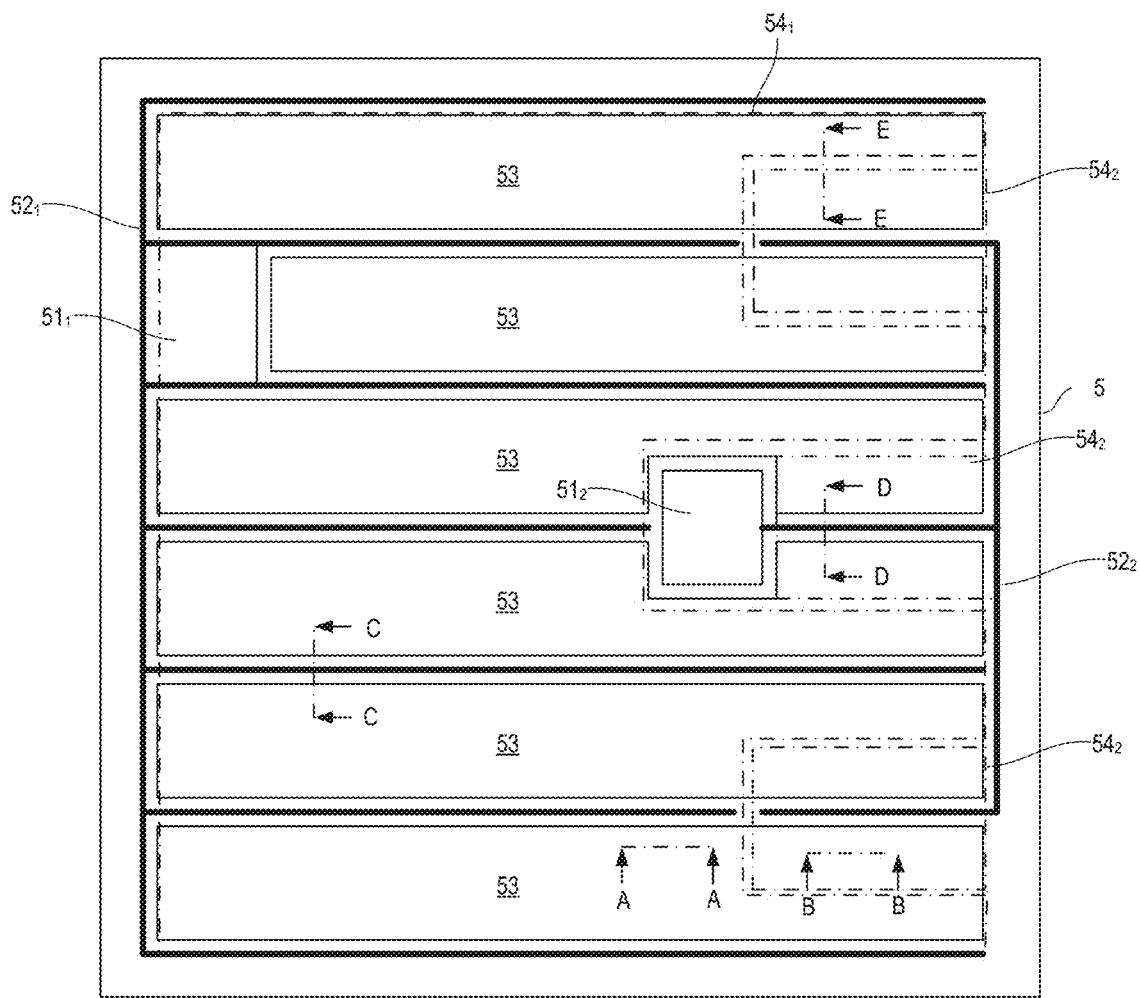

FIGS. 11 and 12 show different examples of a semiconductor die 5 in which the first and second transistor devices 1, 2 are integrated, wherein each of FIGS. 11 and 12 shows a top view of the die 5. In each of the examples shown in FIGS. 11 and 12, the die includes a semiconductor body (out of view in FIGS. 11 and 12) a first gate pad $51_1$, a second gate pad $51_2$, at least one first gate runner $52_1$ (illustrated in bold lines), at least one second gate runner $52_2$, and several source metallizations 53. The first gate pad $51_1$ forms the gate node G1 or is connected to the gate node G1 of the first transistor device 1, the second gate pad $51_2$ forms the gate node G2 or is connected to the gate node G2 of the second transistor device 2, the at least one first gate runner $52_1$ is connected to gate electrodes of transistor cells (not shown in FIGS. 11 and 12) of the first transistor device 1, the at least one second gate runner $52_2$ (illustrated in bold lines) is connected to gate electrodes of transistor cells of the second transistor device 2, and the source metallizations 53 are connected to source regions of transistor cells (not shown in FIGS. 11 and 12) of the first transistor device 1 and/or the second transistor device 2. Each of the first and second transistor devices 1, 2 includes a plurality of transistor cells, wherein active regions of these transistor cells are integrated in the semiconductor body in a way explained in detail herein further below. According to one example, the transistor cells of the first transistor device 1 are integrated in at least one first active region $54_1$ of the semiconductor body, and the transistor cells of the second transistor device 2 are integrated in at least one second active region $54_2$ of the semiconductor body. Positions of the at least one first active region $54_1$ and the at least one second active region $54_2$ are illustrated in dashed and dotted lines in FIGS. 11 and 12.

As can be seen from FIGS. 11 and 12, the at least one first gate runner $54_1$ extends from the first gate pad $51_1$ to the at least one first active region $54_1$. Equivalently, the at least one second gate runner $52_2$ extends from the second gate pad $51_2$ to the at least one second active region $54_2$. In the example shown in FIG. 11, the die 5 includes one first active region $54_1$ and two second active regions $54_2$. In the example shown in FIG. 12, the die includes three first active regions $54_1$ and one second active region $54_2$. This, however, is only an example. The first and second active regions $54_1$, $54_2$ can be distributed in an arbitrary way.

Referring to the above, the first transistor device 1 is smaller than the second transistor device 2. This is equivalent to an overall size of the one or more first active regions $54_1$ being smaller than an overall size of the one or more second active regions $54_2$. According to one example, A1 is an overall area of the one or more first active regions $54_1$ and A2 is an overall area of the one or more second active regions $54_2$. In this case, A1/A2 defines a proportionality factor between the size of the first transistor device 1 and the size of the second transistor device 2.

Figure 13:
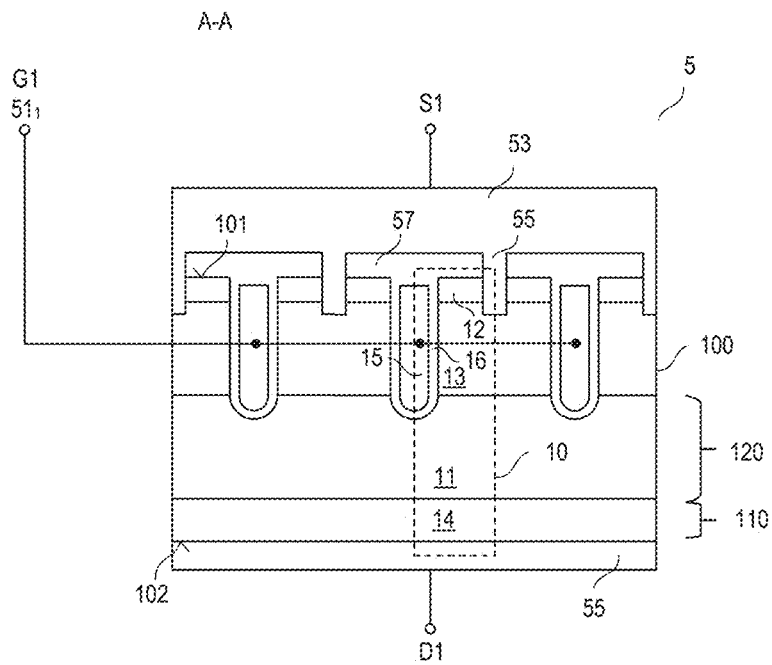
FIGS. 13 and 15 each show a vertical cross sectional view of the semiconductor die in a first active region that includes transistor cells of the first transistor device.
Figure 14:
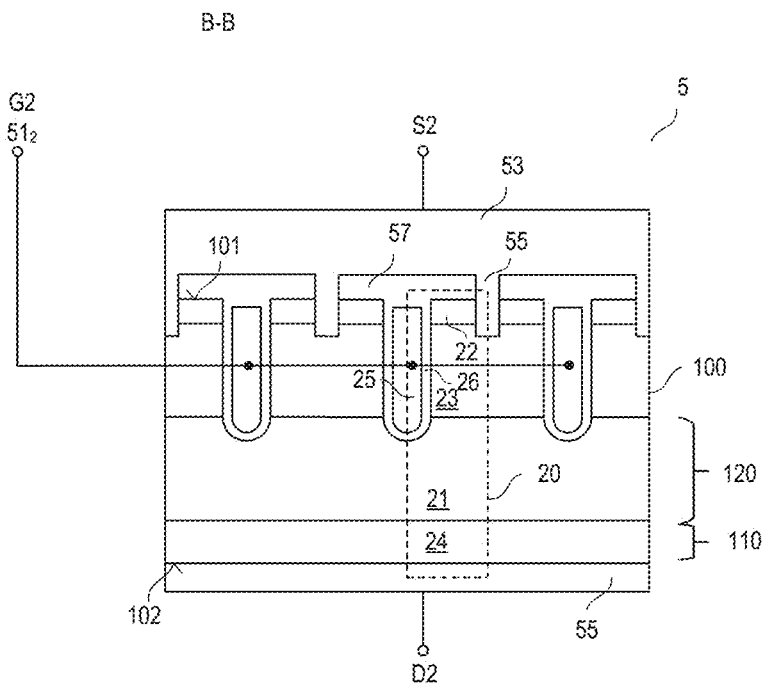
FIGS. 14 and 16 each show a vertical cross sectional view of the semiconductor die in a second active region that includes transistor cells of the second transistor device.

Referring to the above, each of the first and second transistor devices 1, 2 includes a plurality of transistor cells. Examples of these transistor cells 10, 20 are illustrated in FIGS. 13 and 14. FIG. 13 illustrates a vertical cross sectional view of the die 5 in a first vertical section plane A-A that cuts through a first active region $54_1$ in the examples according to FIGS. 11 and 12, and FIG. 14 shows a vertical cross sectional view of the die 5 in a second vertical section plane B-B that cuts through a second active region $54_2$ in the examples according to FIGS. 11 and 12. It should be noted that FIGS. 13 and 14 illustrate only one of several possible examples for implementing the transistor cells 10, 20 of the first and second transistor devices 1, 2.

Referring to FIGS. 13 and 14, each transistor cell 10, 20 includes active device regions in the semiconductor body 100 of the die 5. These active device regions include a drift region 11, 21, a source region 12, 22 separated from the drift region 11, 21 by a body region 13, 23, and a drain region 14, 24. The drain region 14, 24 is spaced apart from the body region 13, 23 and separated from the body region 13, 23 by the drift region 11, 21. Referring to FIGS. 13 and 14, each transistor cell 10, 20 further includes a gate electrode 15, 25 that is arranged adjacent the body region 13, 23 and dielectrically insulated from the body region 13, 23 by a gate dielectric 16, 26. The source regions 12, 22 and body regions 13, 23 of the individual transistor cells 10, 20 are electrically (ohmically) connected to a respective one of the source electrodes 53.

The source electrodes 53 form the source nodes S1, S2 or are connected to the source nodes S1, S2 of the first and second transistor devices 1, 2. Referring to the above, the electronic circuit with the transistor devices 1, 2, 3 and the drive circuit 4 may be integrated in an integrated circuit package with only four terminals. In this case, each of the first and second source nodes S1, S2 is connected to an output node 61 (see, FIG. 1). This output node may be formed by a terminal (pin) of the integrated circuit package, and the source electrodes 53 may be connected to the terminal forming the output node 61 via bond wires, clips, or the like.

Referring to FIGS. 13 and 14, each source electrode 53 may include contact plugs 55 that extend through an insulation layer 57 on top of a first surface 101 of the semiconductor body 100 to the source and body regions 12, 22, 13, 23 of the individual transistor cells 10, 20.

In the examples illustrated in FIGS. 13 and 14, the gate electrodes 15 are located in trenches extending from the first surface 101 into the semiconductor body 100. This, however, is only an example. According to another example (not shown), the gate electrodes 15 are implemented as planar electrodes on top of the first surface 101 of the semiconductor body 100.

Figure 15:
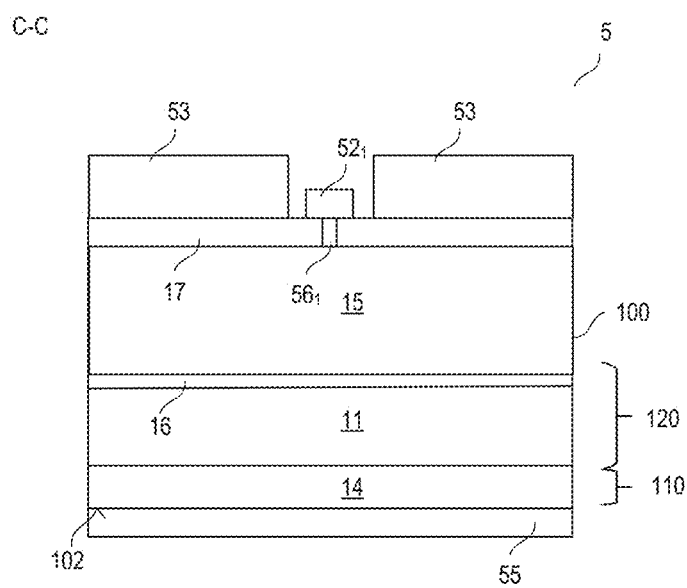

In each case, the gate electrodes 15 of the transistor cells 10 of the first transistor device 1 are connected to the first gate pad $51_1$ via the at least one first gate runner $52_1$, and the gate electrodes 25 of the transistor cells 20 of the second transistor device 2 are connected to the second gate pad $51_2$ via the at least one second gate runner $52_2$. In FIGS. 13 and 15, connections between the gate electrodes 15, 25 and the gate pads $51_1$, $51_2$ are only schematically illustrated. One example for connecting the gate electrodes 15, 25 to the respective gate runner $52_1$, $52_2$ is explained with reference to FIG. 15 herein further below.

Referring to FIGS. 13 and 14, the drain regions 14 of the transistor cells 10 of the first transistor device 1 are connected to the first drain node D1, and the drain regions 24 of the transistor cells 20 of the second transistor device 2 are connected to the second drain node D2. According to one example, the first and second drain nodes D1, D2 are formed by one metallization layer 55 formed on a second surface 102 opposite the first surface 101 of the semiconductor body 100. Furthermore, the drain regions 14, 24 of the transistor cells 10, 20 of the first and second transistor devices 1, 2 may be formed by one contiguous first semiconductor layer 110. The drift regions 11, 21 of the transistor cells 10, 20 of the first and second transistor devices 1, 2 may be formed by one contiguous second semiconductor layer 120 formed on top of the first semiconductor layer 110. According to one example, the first semiconductor layer 110 is a semiconductor substrate, and the second semiconductor layer 120 is a portion of an epitaxial layer formed on top of the substrate. The source and body regions 12, 22, 13, 23 may be formed by implanting and/or diffusing dopant atoms into the epitaxial layer.

In each transistor cell, the source region 12, 22, the drift region 11, 21, and the drain region 14, 24 have the same doping type and the body region 13, 23 has a doping type complementary to the first doping type. In an n-type MOSFET, the source regions 12, 22 and the drift region 11 are n-doped regions while the body regions 13, 23 are p-doped regions. In a p-type MOSFET, the doping types of the individual device regions are complementary to the doping type of the corresponding device regions in an n-type MOSFET. The first and second transistor devices 1, 2 can each be implemented as an enhancement (normally-off) device. In this case, the body regions 13, 23 adjoin the gate dielectrics 16, 26 (as shown in FIGS. 13 and 14). Alternatively, the first transistor device 1 can be implemented as a depletion (normally-on) device. In this case, channel regions (not shown in the drawings) of the same doping type as the source regions 12, 22 and the drift regions 11, 21 extend from the source regions 12, 22 to the drift regions 11, 21 along the gate dielectrics 16, 26 and separate the body regions 13, 23 from the gate dielectrics 16, 26.

Figure 16:
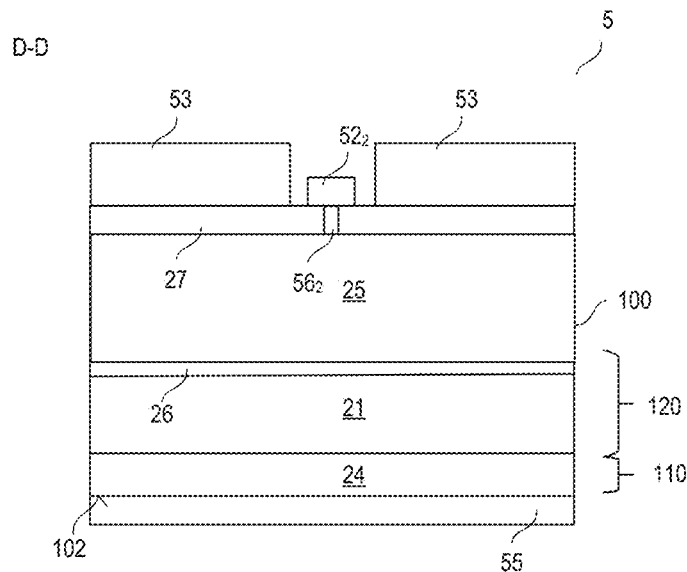

In directions perpendicular to the section planes A-A and B-B shown in FIGS. 13 and 14, the gate electrodes 15, 25 can be elongated. This is illustrated in FIGS. 15 and 16 that show vertical cross sectional views in section planes C-C and D-D illustrated in FIGS. 12 and 13. FIG. 15 shows a cross sectional view of the die 5 in the first active region $54_1$, and FIG. 16 shows a cross sectional view of the die 5 in the second active region $54_1$.

Referring to FIGS. 15 and 16, the first and second gate runners $52_1$, $52_2$ may be arranged on top of the insulation layer 57 and may be connected to the respective gate electrode 15, 25 through an electrically conducting via extending through the insulation layer 57. Each of FIGS. 15 and 16 illustrates one section of one gate electrode 15, 25. It should be noted that each of the gate electrodes 15, 25 is connected to respective gate runner $52_1$, $52_2$ in the same way as illustrated in FIGS. 15 and 16.

Figure 17:
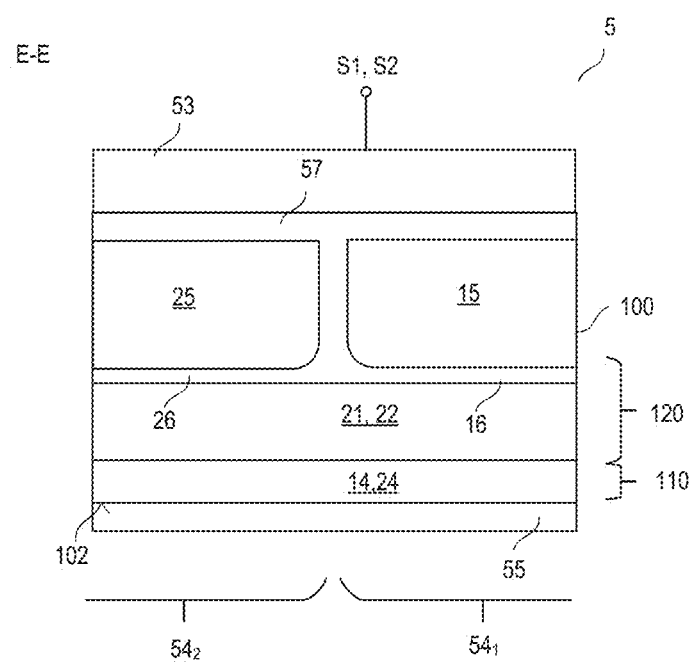
FIG. 17 shows a vertical cross sectional view of the semiconductor die in a region in which the first and second active regions are adjacent to one another.

FIG. 17 shows a vertical cross sectional view of the die in a region in which the first and second active regions $54_1$, $54_2$ are adjacent to one another. More specifically, FIG. 16 shows a vertical cross sectional view of one gate electrode 15 of the first transistor device 1 integrated in the first active region $54_1$ and one gate electrode 25 of the second transistor device 1 integrated in the second active region $54_2$. As can be seen, these gate electrodes 15, 25 are spaced apart from each other and electrically insulated from one another, wherein the gate electrode 15 of the first transistor device 1 is connected to a first gate runner $52_1$ (not shown in FIG. 16) and the gate electrode 25 of the second transistor device 2 is connected to a second gate runner $52_2$ (not shown in FIG. 16).

Figure 18:
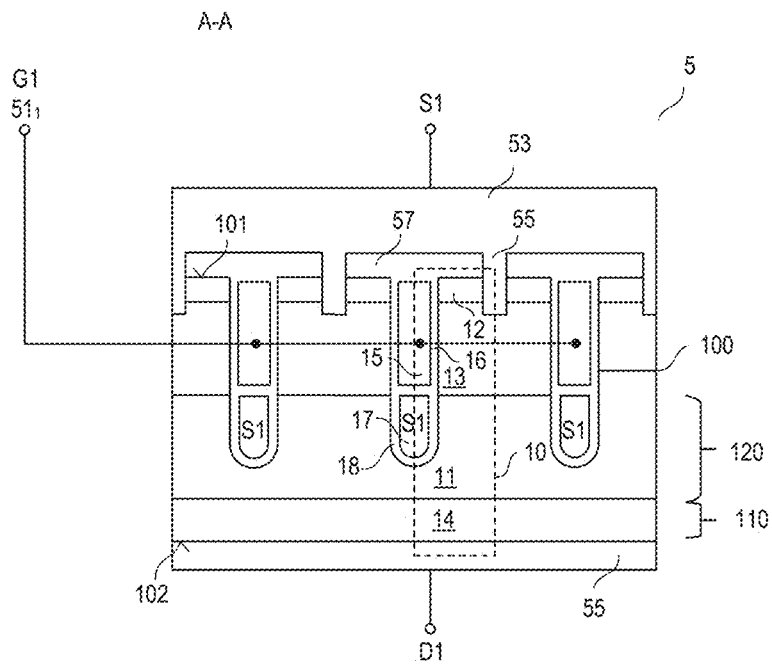
FIG. 18 shows a vertical cross sectional view of the semiconductor die in the first active region according to another example.
Figure 19:
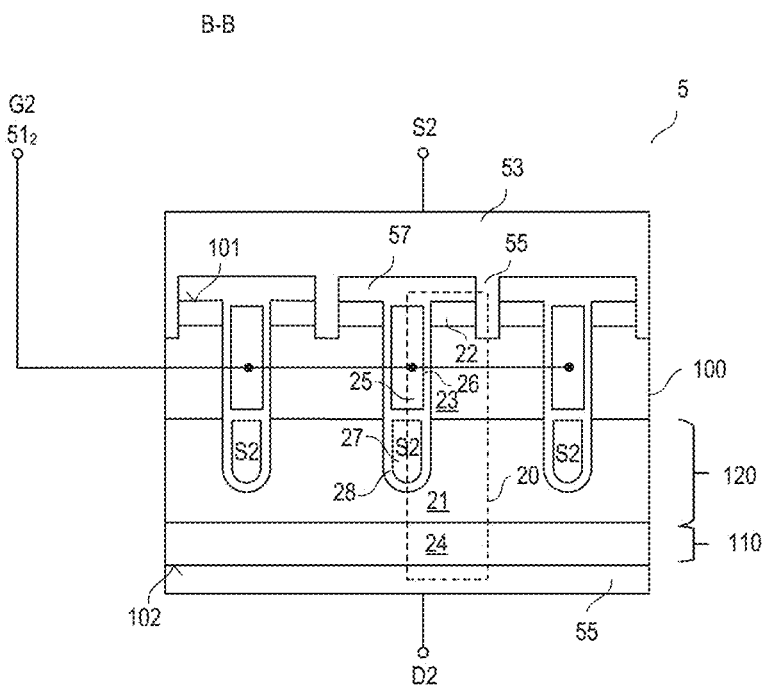
FIG. 19 shows a vertical cross sectional view of the semiconductor die in the second active region according to another example.

FIGS. 18 and 19 show modifications of the transistor cells 10, 20 shown in FIGS. 13 and 14. The transistor cells 10, 20 shown in FIGS. 18 and 19 are based on the transistor cells 10, 20 shown in FIGS. 13 and 14 and additionally include a respective field electrode 17, 27 that is located adjacent to the drift region 11, 21 and is dielectrically insulated from the drift region 11, 21 by field electrode dielectric 18, 28. The field electrodes 17, 27 are connected to the source nodes S1, S2, wherein connections between the field electrodes 17, 27 and the source nodes S1, S2 are not shown in FIGS. 18 and 19.

Figure 20:
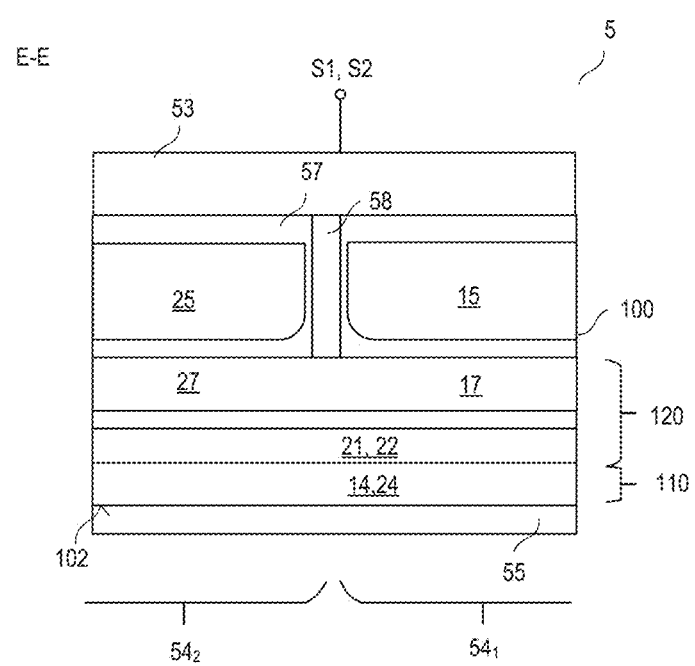
FIG. 20 shows a vertical cross sectional view of the semiconductor die in a region in which first and second active regions of the type shown in FIGS. 18 and 19 are arranged adjacent to one another.

Connections between the field electrodes 17, 27 and the source nodes S1, S2 may be implemented as illustrated in FIG. 20. FIG. 20 shows a vertical cross sectional view in section plane E-E in an example in which the first and second transistor device 1, 2 are implemented as illustrated in FIGS. 18 and 19. The example shown in FIG. 20 is based on the example shown in FIG. 17 and shows sections of first and second gate electrodes 15, 25 and sections of field electrodes 27, 28. The field electrodes 27, 28 may be formed by one electrode arranged in the trench below the first and second gate electrodes 15, 25. The electrode forming the field electrodes 17, 27 may be connected to a source metallization 53 through a conductor 58, wherein the conductor 58 is arranged between the first and second gate electrodes 15, 25 and, in the vertical direction, extends from the field electrode to the source metallization.

Example 1. An electronic circuit, including: a first transistor device, a second transistor device, and a third transistor device, each including a control node and a load path; and a drive circuit, wherein the load paths of the first and second transistor devices are connected in parallel, wherein the load path of the third transistor device is connected in series with the load paths of the first and second transistor devices, wherein the first transistor device and the second transistor device are integrated in a common semiconductor body, and wherein the drive circuit is configured, based on a control signal, to successively switch on the first transistor device and the second transistor device, so that the second transistor device is switched on after the first transistor device has been switched on.

Example 2. The electronic circuit of example 1, wherein the drive circuit is further configured, based on the control signal, to successively switch off the second transistor device and the first transistor device, so that the first transistor device is switched off after the second transistor device has been switched off.

Example 3. The electronic circuit of example 1 or 2, wherein the drive circuit is further configured, in each of the of plurality drive cycles, to switch on the third transistor device after the first transistor device has been switched off.

Example 4. The electronic circuit of any one of examples 1 to 3, wherein the drive circuit is configured to generate a first drive signal and a second drive signal, and wherein the drive circuit, to switch on the first transistor device, is configured to generate an on-level of the first drive signal, to switch on the second transistor device, is configured to generate an on-level of the second drive signal, and to switch on the second transistor device when the first transistor device is in the on-state, is configured to generate the on-level of the second drive signal after a first delay time after generating the on-level of the first drive signal.

Example 5. The electronic circuit of example 4, wherein the first delay time is selected from between 0.5 nanoseconds and 2 nanoseconds.

Example 6. The electronic circuit of example 1 or 2, wherein the drive circuit is configured to generate a first drive signal and a second drive signal, and wherein the drive circuit, to switch off the first transistor device, is configured to generate an off-level of the first drive signal, to switch off the second transistor device, is configured to generate an off-level of the second drive signal, and to switch off the first transistor device when the second transistor device is in the off-state, is configured to generate the off-level of the first drive signal after a second delay time after generating the off-level of the second drive signal.

Example 7. The electronic circuit of example 6, wherein the second delay time is selected from between 1 nanosecond and 10 nanoseconds.

Example 8. The electronic circuit of any one of the preceding examples, wherein, in the semiconductor body, the first transistor device occupies between 1% and 20% of an overall area occupied by the first transistor device and the second transistor device.

Example 9. The electronic circuit of example 8, wherein the first transistor device occupies between 5% and 15% of the overall area occupied by the first transistor device and the second transistor device.

Example 10. The electronic circuit of any one of the preceding examples, further including: a fourth transistor device configured to switch off the third transistor device, wherein the drive circuit is further configured to drive the fourth transistor device.

Example 11. The electronic circuit of any one of the preceding examples, wherein the first, second, and third transistor devices and the drive circuit are integrated in one integrated circuit package.

Example 12. The electronic circuit of example 11, wherein the first and second transistor devices are integrated in a first semiconductor die, and wherein the drive circuit is integrated in a second semiconductor die different from the first semiconductor die.

Example 13. The electronic circuit of example 12, wherein the third transistor device is integrated in the first semiconductor die.

Example 14. The electronic circuit of example 12, wherein the third transistor device is integrated in a third semiconductor die different from the first and second semiconductor dies.

Example 15. A buck converter, including: an electronic circuit in accordance with any one of examples 1-14; an inductor connected to a circuit node between the load path of the first transistor device and the load path of the third transistor device; a capacitor connected to the inductor and configured to provide an output voltage; and a controller configured to generate the control signal based on the output voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
    a first transistor device, a second transistor device, and a third transistor device, each comprising a control node and a load path; and
    a drive circuit,
    wherein the load paths of the first and second transistor devices are connected in parallel,
    wherein the load path of the third transistor device is connected in series with the load paths of the first and second transistor devices,
    wherein the first transistor device and the second transistor device are integrated in a common semiconductor body,
    wherein the drive circuit is configured, based on a control signal, to successively switch on the first transistor device and the second transistor device, so that the second transistor device is switched on after the first transistor device has been switched on,
    wherein the first and second transistor devices are integrated in a first semiconductor die,
    wherein the first semiconductor die includes the common semiconductor body, a first gate pad, a second gate pad, at least one first gate runner, at least one second gate runner, and a plurality of source metallizations,
    wherein the first gate pad forms a gate node of the first transistor device or is connected to the gate node of the first transistor device,
    wherein the second gate pad forms a gate node of the second transistor device or is connected to the gate node of the second transistor device,
    wherein the at least one first gate runner is connected to gate electrodes of transistor cells of the first transistor device,
    wherein the at least one second gate runner is connected to gate electrodes of transistor cells of the second transistor device, and
    wherein the plurality of source metallizations is connected to source regions of the transistor cells of the first transistor device and/or source regions of the second transistor device.

2. The electronic circuit of claim 1, wherein the drive circuit is further configured, based on the control signal, to successively switch off the second transistor device and the first transistor device, so that the first transistor device is switched off after the second transistor device has been switched off.

3. The electronic circuit of claim 1, wherein the drive circuit is further configured, in each of a plurality drive cycles, to switch on the third transistor device after the first transistor device has been switched off.

4. The electronic circuit of claim 1,
    wherein the drive circuit is configured to generate a first drive signal and a second drive signal,
    wherein the drive circuit, to switch on the first transistor device, is configured to generate an on-level of the first drive signal,
    wherein the drive circuit, to switch on the second transistor device, is configured to generate an on-level of the second drive signal, and
    wherein the drive circuit, to switch on the second transistor device when the first transistor device is in the on-state, is configured to generate the on-level of the second drive signal after a first delay time after generating the on-level of the first drive signal.

5. The electronic circuit of claim 4, wherein the first delay time is selected from between 0.5 nanoseconds and 2 nanoseconds.

6. The electronic circuit of claim 1,
    wherein the drive circuit is configured to generate a first drive signal and a second drive signal,
    wherein the drive circuit, to switch off the first transistor device, is configured to generate an off-level of the first drive signal,
    wherein the drive circuit, to switch off the second transistor device, is configured to generate an off-level of the second drive signal, and
    wherein the drive circuit, to switch off the first transistor device when the second transistor device is in the off-state, is configured to generate the off-level of the first drive signal after a second delay time after generating the off-level of the second drive signal.

7. The electronic circuit of claim 6, wherein the second delay time is selected from between 1 nanosecond and 10 nanoseconds.

8. The electronic circuit of claim 1, wherein in the common semiconductor body, the first transistor device occupies between 1% and 20% of an overall area occupied by the first transistor device and the second transistor device.

9. The electronic circuit of claim 8, wherein the first transistor device occupies between 5% and 15% of the overall area occupied by the first transistor device and the second transistor device.

10. The electronic circuit of claim 1, further comprising:
    a fourth transistor device configured to switch off the third transistor device,
    wherein the drive circuit is further configured to drive the fourth transistor device.

11. The electronic circuit of claim 1, wherein the first, second, and third transistor devices and the drive circuit are integrated in one integrated circuit package.

12. The electronic circuit of claim 11, wherein the drive circuit is integrated in a second semiconductor die different from the first semiconductor die.

13. The electronic circuit of claim 12, wherein the third transistor device is integrated in the first semiconductor die.

14. The electronic circuit of claim 12, wherein the third transistor device is integrated in a third semiconductor die different from the first and second semiconductor dies.

15. A buck converter, comprising:
    the electronic circuit of claim 1;
    an inductor connected to a circuit node between the load path of the first transistor device and the load path of the third transistor device;
    a capacitor connected to the inductor and configured to provide an output voltage; and
    a controller configured to generate the control signal based on the output voltage.

16. The electronic circuit of claim 1, wherein the transistor cells of the first transistor device are integrated in at least one first active region of the common semiconductor body, wherein the transistor cells of the second transistor device are integrated in at least one second active region of the common semiconductor body, wherein the at least one first gate runner extends from the first gate pad to the at least one first active region, and wherein the at least one second gate runner extends from the second gate pad to the at least one second active region.

17. The electronic circuit of claim 11, wherein a source node of the first transistor device and a source node of the second transistor device are connected to an output node of the electronic circuit, and wherein the output node is formed by a terminal/pin of the integrated circuit package.

18. The electronic circuit of claim 1, wherein the at least one first gate runner and the at least one second gate runner are arranged on top of an insulation layer and connected to the gate electrodes of the respective transistor cells through an electrically conducting via extending through the insulation layer.

19. The electronic circuit of claim 1, wherein a first gate electrode of a transistor cell of the first transistor device and a second gate electrode of a transistor cell of the second transistor device are disposed in a same trench and electrically insulated from one another, and wherein a common field electrode disposed in the trench below the first and second gate electrodes is connected to a source metallization through a conductor arranged between the first and second gate electrodes.

20. An electronic circuit, comprising:
a first transistor device, a second transistor device, and a third transistor device, each comprising a control node and a load path;
a drive circuit; and
a fourth transistor device driven by a drive signal provided by the drive circuit and configured to switch off the third transistor device,
wherein the load paths of the first and second transistor devices are connected in parallel,
wherein the load path of the third transistor device is connected in series with the load paths of the first and second transistor devices,
wherein the first transistor device and the second transistor device are integrated in a common semiconductor body,
wherein the drive circuit is configured, based on a control signal, to successively switch on the first transistor device and the second transistor device, so that the second transistor device is switched on after the first transistor device has been switched on,
wherein the fourth transistor device includes a load path connected between the control node and a source node of the third transistor device.

* * * * *